(12) United States Patent
Martinis et al.

(10) Patent No.: US 11,651,263 B2
(45) Date of Patent: May 16, 2023

(54) NONLINEAR CALIBRATION OF A QUANTUM COMPUTING APPARATUS

(71) Applicant: Google LLC, Mountain View, CA (US)

(72) Inventors: John Martinis, Santa Barbara, CA (US); Yu Chen, Goleta, CA (US); Hartmut Neven, Malibu, CA (US); Dvir Kafri, Los Angeles, CA (US)

(73) Assignee: Google LLC, Mountain View, CA (US)

(*) Notice: Subject to any disclaimer, the term of this patent is extended or adjusted under 35 U.S.C. 154(b) by 605 days.

(21) Appl. No.: 16/624,037

(22) PCT Filed: Dec. 15, 2017

(86) PCT No.: PCT/US2017/066783
§ 371 (c)(1),
(2) Date: Dec. 18, 2019

(87) PCT Pub. No.: WO2019/005206
PCT Pub. Date: Jan. 3, 2019

(65) Prior Publication Data
US 2021/0035005 A1    Feb. 4, 2021

Related U.S. Application Data

(60) Provisional application No. 62/525,058, filed on Jun. 26, 2017.

(51) Int. Cl.
*G06N 10/00* (2022.01)
*G06F 30/25* (2020.01)
(Continued)

(52) U.S. Cl.
CPC ........... *G06N 10/00* (2019.01); *G06F 18/214* (2023.01); *G06F 30/25* (2020.01)

(58) Field of Classification Search
CPC ........ G06N 10/00; G06N 10/20; G06N 10/40; G06N 10/60; G06N 10/70; G06N 10/80; G06F 30/25; G06K 9/6256
See application file for complete search history.

(56) References Cited

U.S. PATENT DOCUMENTS

2009/0299947 A1    12/2009    Amin et al.
2014/0229722 A1    8/2014     Harris
(Continued)

FOREIGN PATENT DOCUMENTS

JP    2017507439    3/2017
JP       6852192    3/2021
WO   WO 2017/078734    5/2017

OTHER PUBLICATIONS

McCormick, Chris. Gradient Descent Derivation, https://mccormickml.com/2014/03/04/gradient-descent-derivation/. Article dated Mar. 4, 2014. Accessed Jul. 25, 2022. (Year: 2014).*

(Continued)

*Primary Examiner* — Markus A. Vasquez
(74) *Attorney, Agent, or Firm* — Fish & Richardson P.C.

(57) ABSTRACT

Methods, systems, and apparatus for nonlinear calibration of quantum computing apparatus. In one aspect, elements in a set of experimental data correspond to a respective configuration of control biases for the quantum computing apparatus. An initial physical model comprising one or more model parameters of the quantum computing apparatus is defined. The model is iteratively adjusted to determine a revised physical model, where at each iteration: a set of predictive data corresponding to the set of experimental data is generated, and elements in the predictive data represent a difference between the two smallest eigenvalues of a Hamiltonian characterizing the system qubits for the previous iteration, and are dependent on at least one model parameter of the physical model for the previous iteration; and the (Continued)

model for the previous iteration is adjusted using the obtained experimental data and the generated set of predictive data for the iteration.

18 Claims, 5 Drawing Sheets

(51) Int. Cl.
    *G06K 9/62*           (2022.01)
    *G06F 18/214*      (2023.01)

(56)           References Cited

U.S. PATENT DOCUMENTS

| | | | |
|---|---|---|---|
| 2016/0283857 A1* | 9/2016 | Babbush | G06F 15/82 |
| 2017/0017894 A1* | 1/2017 | Lanting | G06F 15/82 |
| 2017/0179973 A1 | 6/2017 | Bulzacchelli et al. | |
| 2017/0228483 A1* | 8/2017 | Rigetti | G06F 30/367 |

OTHER PUBLICATIONS

Wikipedia. Perturbation theory (quantum mechanics). https://en.wikipedia.org/w/index.php?title=Perturbation_theory_(quantum_mechanics)&oldid=783158672. Article dated May 31, 2017. Accessed Jul. 25, 2022. (Year: 2017).*
Cao, Yudong, et al. "Towards experimentally realizable Hamiltonian gadgets." ArXiv e-prints 1311 (2013). (Year: 2013).*
Greiner, Walter. Quantum mechanics: an introduction. Chapter 11. Springer Science & Business Media, 2011. (Year: 2011).*
Office Action in Korean Appln. No. 10-2019-7033204, dated Oct. 25, 2021, 11 pages (with English translation).
Rupak Biswas et al., "A NASA perspective on quantum computing: Opportunities and challenges," Parallel Computing, Nov. 2016, 64:81-98.
PCT International Preliminary Report on Patentability in International Appln No. PCT/US2017/066783, dated Dec. 31, 2019, 9 pages.
Office Action in European Appln. No. 17829421.1, dated Jun. 30, 2021, 9 pages.
CA Office Action in Canadian Appln. No. 3,062,793, dated Feb. 23, 2021, 6 pages.
JP Decision to Grant a Patent in Japanese Appln. No. 2019-561982, dated Feb. 8, 2021, 5 pages (with English translation).
Kosut et al., "Indirect adaptive control of quantum systems," IFAC Lagrangian and Hamiltonian Methods for Nonlinear Control, 2003, 227-232.
Madavia et al., "Prediction and real-time compensation of qubit decoherence via machine learning," Nature Communications, Jan. 2017, 8:14106, 6 pages.
PCT International Search Report and Written Opinion in International Appln. No. PCT/US2017/066783, dated Apr. 4, 2018, 16 pages.
PCT Written Opinion in International Appln, No. PCT/US2017/066783, dated Jul. 6, 2019, 8 pages.
Wang et al., "Experimental quantum Hamiltonian learning," Nature Physics, Mar. 2017, 13(6): 551-555.
Allowance of Patent in Korean Appln. No. 10-2019-7033204, dated Mar. 30, 2022, 3 pages (with English translation).
Office Action in Japanese Appln. No. 2021-038253, dated April 4, 2022, 8 pages (with English translation).
AU Office Action in Australian Appln. No. 2017420803, dated May 26, 2020, 4 pages.
Office Action in Chinese Appln. No. 201780090557.0, dated Sep. 30, 2022, 8 pages (with English Translation).
Office Action in Korean Appln. No. 10-2022-7022422, dated Dec. 8, 2022, 6 pages (with English Translation).

* cited by examiner

NONLINEAR CALIBRATION OF A QUANTUM COMPUTING APPARATUS

CROSS-REFERENCE TO RELATED APPLICATION

This application is a National Stage Application under 35 U.S.C. § 371 and claims the benefit of International Application No. PCT/US2017/066783, filed on Dec. 15, 2017, which claims priority to U.S. Provisional Application Ser. No. 62/525,058, filed on Jun. 26, 2017. The disclosures of each of the prior applications are considered part of and are incorporated by reference in the disclosure of this application in their entirety.

BACKGROUND

The present disclosure relates to nonlinear calibration of quantum computing apparatuses.

Quantum computing devices use quantum-mechanical phenomena such as superposition and entanglement to perform operations on data. Quantum computing devices operate using two-level quantum mechanical systems called qubits. Example physical implementations of qubits include superconducting qubits realized using Josephson junctions.

SUMMARY

The present disclosure covers technologies for calibrating quantum computing apparatuses. In particular, the present invention describes systems and methods for calibrating values of physical parameters of a quantum system, e.g., a system of qubits.

In general, an innovative aspect of the subject matter described in this specification includes methods for generating a revised physical model, the revised physical model representing a system of superconducting qubits and being suitable for use in simulating the system of superconducting qubits, the system of superconducting qubits operable via a set of control biases, the method including: obtaining a set of experimental data, wherein elements in the set of experimental data (i) correspond to a respective configuration of control biases, and (ii) comprise a measurement result of an observable of the system of superconducting qubits for the respective configuration of control biases; defining an initial physical model representing the system of superconducting qubits, the initial physical model comprising one or more model parameters; iteratively adjusting the defined initial physical model to determine a revised physical model representing the system of superconducting qubits, comprising, for each iteration: generating a set of predictive data for the iteration, the generated set of predictive data corresponding to the set of experimental data, wherein elements in the set of predictive data for the iteration (i) represent a difference between the two smallest eigenvalues of a Hamiltonian characterizing the system of superconducting qubits represented by a physical model for the previous iteration, and (ii) are dependent on at least one model parameter of the physical model for the previous iteration; and adjusting the physical model for the previous iteration using the obtained experimental data and the generated set of predictive data for the iteration.

Other implementations of this aspect include corresponding computer systems, apparatus, and computer programs recorded on one or more computer storage devices, each configured to perform the actions of the methods. A system of one or more computers can be configured to perform particular operations or actions by virtue of having software, firmware, hardware, or a combination thereof installed on the system that in operation causes or cause the system to perform the actions. One or more computer programs can be configured to perform particular operations or actions by virtue of including instructions that, when executed by data processing apparatus, cause the apparatus to perform the actions.

The foregoing and other implementations can each optionally include one or more of the following features, alone or in combination. In some implementations the method further comprises using the revised physical model to model the behavior of the system of superconducting qubits.

In some implementations using the revised physical model to model the behavior of the system of superconducting qubits comprises: fixing the revised physical model; and determining one or more control bias configurations that, when applied to the superconducting qubits, cause the system of superconducting qubits to have one or more target properties.

In some implementations the system of superconducting qubits comprises a quantum annealer circuit.

In some implementations generating a set of predictive data for an iteration comprises, for each configuration of control biases: defining a Hamiltonian characterizing the system of superconducting qubits represented by the physical model for a previous iteration, the Hamiltonian being dependent on the configuration of control biases and the at least one model parameter; determining the two lowest eigenvalues of the defined Hamiltonian; and generating an element of the set of predictive data for the configuration of control biases representing the difference between the determined two lowest eigenvalues of the defined Hamiltonian.

In some implementations defining the initial physical model comprises applying experimental techniques to estimate the at least one model parameter.

In some implementations adjusting the physical model for a previous iteration using the obtained experimental data and the generated set of predictive data for the iteration comprises: defining a cost function that depends on differences between elements of the set of experimental data and elements of the set of predictive data; and minimizing the defined cost function with respect to the at least one model parameter.

In some implementations the cost function is represented by $$C(\bar{\lambda}) = \frac{1}{2N}\sum_{i=1}^{N}(E(\bar{z}_i) - E_m(\bar{z}_i; \bar{\lambda}))^2$$

where $\bar{\lambda}$ represents the at least one model parameter, N represents the number of configurations of control biases $\bar{z}_i$, $E(\bar{z}_i)$ represents experimental data corresponding to control bias configuration i and $E_m(\bar{z}_i; \bar{\lambda})$ represents predictive data corresponding to control bias configuration i.

In some implementations minimizing the defined cost function with respect to the at least one model parameter comprises determining gradients of the cost function with respect to the at least one model parameter.

In some implementations determining gradients of the cost function with respect to the at least one model parameter comprises applying matrix perturbation theory.

In some implementations applying matrix perturbation theory comprises using the determined eigenvalues and eigenvectors of the Hamiltonian characterizing the system of superconducting qubits represented by the physical model.

In some implementations a Hamiltonian characterizing the system of superconducting qubits represented by a physical model comprises an effective Hamiltonian describing interactions between the superconducting qubits.

In some implementations the effective Hamiltonian is defined using a physical approximation, optionally including the Born-Oppenheimer Approximation.

In some implementations a Hamiltonian characterizing the system of superconducting qubits represented by a physical model describes more interacting components than the effective Hamiltonian.

In some implementations the one or more observables comprise one or more Hamiltonians describing the system of superconducting qubits for respective configurations of control biases, and wherein the set of experimental data comprises measured energy spectrum values of the system of superconducting qubits for respective configurations of control biases.

In some implementations the set of predictive data comprises predicted energy spectrum values of the system of superconducting qubits for respective configurations of control biases.

In some implementations the superconducting qubits comprise flux qubits.

In some implementations the control biases comprise voltages or currents.

In some implementations the at least one model parameter comprises a physical parameter defining the system of superconducting qubits.

The subject matter described in this specification can be implemented in particular ways so as to realize one or more of the following advantages.

A system implementing non linear calibration of quantum computing systems, as described in the present disclosure, may perform a calibration procedure that concurrently incorporates all physical model parameters and does not perform independent calibrations of subsets of physical model parameters. By concurrently incorporating all physical model parameters, inconsistencies in the physical model representing the quantum computing system can be reduced or eliminated. The calibration procedure may therefore be more accurate compared to other calibration procedures implemented by other systems.

Calibrated parameter values, also referred to as revised physical model parameters herein, generated by the calibration procedure described in the present disclosure may be used to model (also referred to as simulate) a physical quantum system represented by the model, or to control a physical quantum system represented by the model. Since the calibration procedure may be more accurate compared to other calibration procedures, the system described in the present disclosure may provide more accurate models or more precise control of physical quantum systems represented by the physical model.

A system implementing non linear calibration of quantum computing systems, as described in the present disclosure, may perform a calibration procedure by efficiently computing gradients of a calibration cost function using matrix perturbation theory. By efficiently computing gradients of a calibration cost function, the calibration procedure may be more efficient and require less computational resources compared to other systems and methods for performing quantum computing system calibration.

A system implementing non linear calibration of quantum computing systems, as described in the present disclosure, may perform a calibration procedure that is easily modular in the sense that it can directly incorporate standard physics approximations (such as the Born-Oppenheimer Approximation). The resulting calibration procedure may therefore be more accurate and/or computationally efficient compared to other systems for calibrating quantum computing systems.

The details of one or more implementations of the subject matter of this specification are set forth in the accompanying drawings and the description below. Other features, aspects, and advantages of the subject matter will become apparent from the description, the drawings, and the claims.

DETAILED DESCRIPTION

Figure 1:
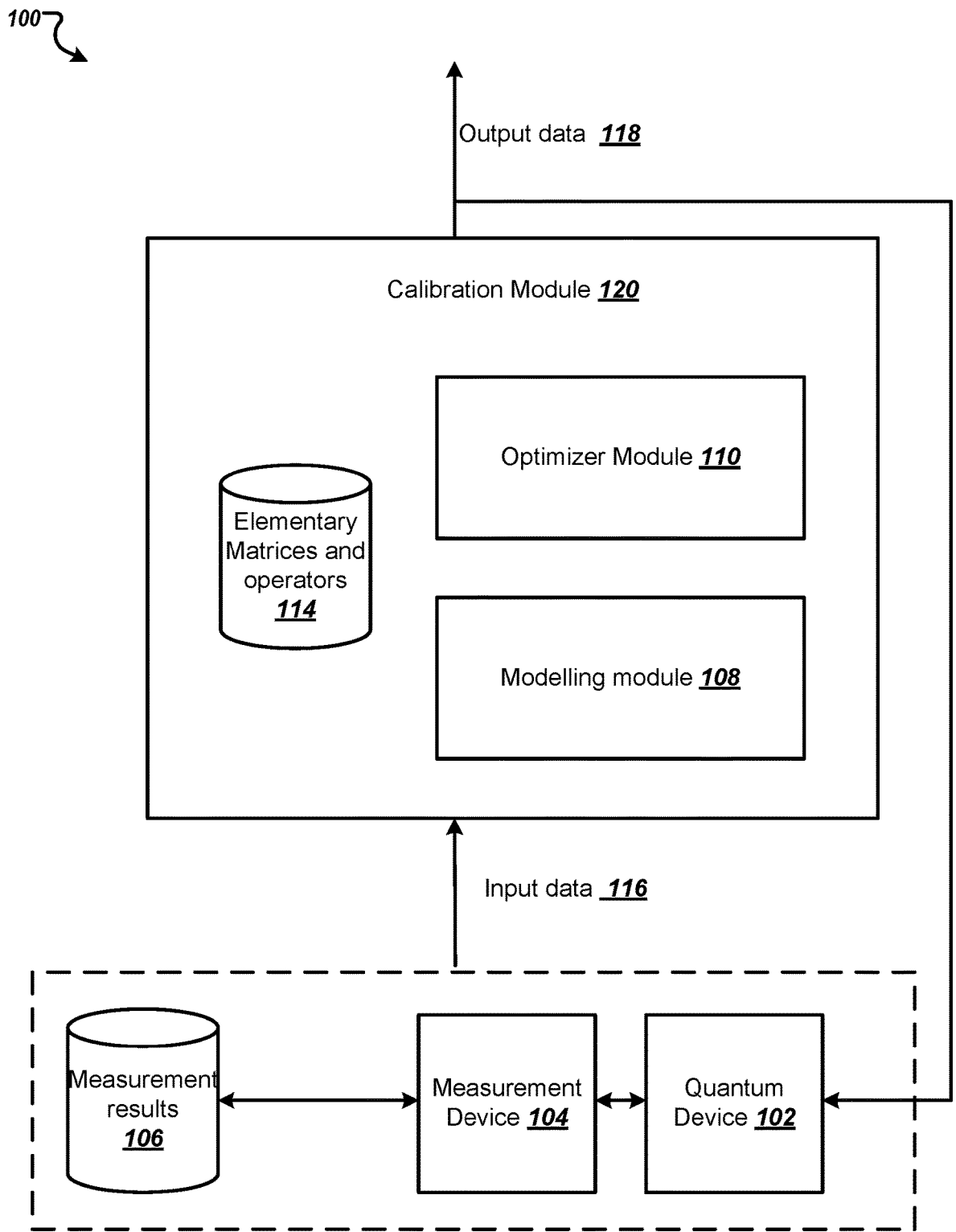
FIG. 1 is a schematic depicting an example calibration system.

Quantum computing devices include physical quantum systems, e.g., systems of superconducting qubits, which may be used to perform computations or to simulate other physical systems. An important part of fabricating quantum computing devices is modeling (also referred to as simulating) the device in order to determine properties of the device or to predict how the device will behave for different control settings.

Models of quantum computing devices depend on physical parameters specific to the quantum system included in the quantum computing device, e.g., capacitance, inductance, or critical current in the case of systems of superconducting qubits. More specifically, for a model to faithfully represent a quantum computing device, optimal values of physical parameters specific to the quantum system included in the quantum computing device must be calculated and fixed.

For example, to model a quantum computing device, a Hamiltonian matrix characterizing the quantum system included in the device may be constructed. The Hamiltonian matrix depends on physical parameters specific to the quantum system and on tunable control biases, e.g., biases that are proportional to externally applied voltages or currents that effect changes in superconducting qubits, that are used to control the quantum system. Fixing the values of the physical parameters and adjusting the tunable control biases may cause the Hamiltonian matrix to have target properties. Since the Hamiltonian matrix is constructed to model the device, the same adjustment and application of control biases should also cause the quantum system to have the same target properties.

Therefore, in order to accurately model the quantum device, the constructed Hamiltonian matrix must be a good model for the physical system. That is, properties of the constructed Hamiltonian matrix must match target properties of the quantum system. If this is not the case, particular configurations of control biases may be used to cause the Hamiltonian matrix to have the desired properties, but applying those same configurations of control biases to the physical quantum system may not. To construct a good model for the physical system, calibrated values of the physical parameters specific to the quantum system must be determined.

The present disclosure covers nonlinear calibration of quantum system physical parameters. In particular implementations, the present disclosure covers methods and systems for using experimental data, e.g., values of an energy spectrum, at various configurations of control biases to calibrate the physical parameters of a quantum system. Techniques such as nonlinear regression may be applied to estimate values of physical parameters that most closely predict corresponding experimental data. Calibrated values of physical parameters can then be used to make precise predictions about the behavior of the quantum system. For example, as described above, calibrated values of physical parameters can be fixed and used to construct a corresponding Hamiltonian matrix.

As an example, a quantum annealing device can be used to solve computational problems by mapping a Hamiltonian describing the physical quantum system included in the quantum annealing device to an optimization task, then allowing the physical quantum system to dynamically evolve to a low energy configuration. Such a mapping may be achieved by calibrating physical parameters specific to the quantum system included in the quantum annealing device and applying control biases to the quantum system so that its Hamiltonian matches the problem of interest.

Example Operating Environment

FIG. 1 is a schematic depicting an example calibration system 100. The system 100 is an example of a system executing classical or quantum computer programs on one or more classical computers or quantum computing devices in one or more locations, in which the systems, components, and techniques described below can be implemented.

The calibration system 100 may include a quantum device 102, measurement device 104, and a calibration module 120. Optionally the system 100 may further include a database 106 storing measurement results. The calibration system 100 may be configured to generate or otherwise obtain a set of experimental data and provide the set of experimental data to the calibration module 120, e.g., as input data 116. The calibration module 120 may be configured to process the received set of experimental data and to generate output data representing physical model parameters, e.g., output data 118. The output data 118 representing physical model parameters represent a physical model for the quantum device 102. For convenience, the terms "physical model parameters" and "physical model" are therefore considered synonymous throughout this specification.

The quantum device 102 may be a device that includes a physical quantum system, e.g., a system of qubits, which is used to perform quantum computations or simulations. The type of physical quantum system included in the quantum device 102 is dependent on the type of quantum device 102 and the computations performed by the quantum device 102. For example, in some cases the quantum device 102 may be a quantum annealing device that includes a circuit of superconducting qubits, e.g., flux qubits. For convenience, methods and systems described in the present disclosure are described with reference to a physical quantum system of superconducting qubits. However, the systems and methods may also be applied generally to other physical quantum systems such as semiconductor quantum dots, superconducting nanowires, nitrogen vacancy centers, or trapped neutral/ionic atoms.

The quantum device 102 may be configured to operate the physical quantum system included in the quantum device using one or more tunable control biases. The types of tunable control biases used by the quantum device 102 is dependent on the type of physical system included in the quantum device 102. For example, in cases where the quantum device 102 includes a system of superconducting qubits, e.g., arranged as a superconducting circuit, the tunable control biases may include biases that are proportional to externally applied voltages or currents that effect changes in the superconducting qubits. Different configurations of tunable control biases may have different effects on the physical quantum system.

The physical quantum system included in the quantum device 102 may be associated with one or more respective fixed values of physical parameters that define properties of the physical system. For example, physical parameters describing systems of superconducting qubits may include a capacitance of a capacitor included in the system of superconducting qubits, or the critical current of a Josephson junction included in the system of superconducting qubits. As another example, physical parameters describing systems of superconducting qubits may include parameters that determine how a given control bias changes a Hamiltonian matrix characterizing the system of superconducting qubits, e.g. the mutual inductance between a circuit and a nearby control wire determines how much flux is applied to the qubit from a given amount of control current. In these examples, a fixed set of values of the physical parameters defines or corresponds to a respective physical quantum system.

The measurement device 104 may be in communication with the quantum device 102 and configured to perform measurements on the physical quantum system included in the quantum device 102. For example, the measurement device 104 may include one or more oscillators, e.g., readout resonators, which are configured to measure respective qubits included in the quantum device 102. The measurement device 104 may be configured to perform various measurements on the physical quantum system included in the quantum device 102. For example, the measurement device 104 may be configured to measure the energy of the physical system or other quantities corresponding to quantum mechanical observables. Measurements performed by the measurement device 104 may be associated with respective configurations of control biases.

The measurement device 104 may be configured to provide obtained measurement results as input data to the calibration module 120 and/or to a database, e.g., measurement result database 106 for storing. The measurement result database 106 may be configured to store received data representing obtained measurement results and to provide stored data representing obtained measurement results to the calibration module 120, e.g., in response to a request received from the calibration module 120.

As described herein, the calibration module 120 is a processor configured to obtain input data representing experimental data, e.g., measurement results, from the measurement device 104 or the measurement result database 106. The experimental data may correspond to particular configurations of control biases applied to the physical quantum system at the time of the measurement and include an observable measurement, as described herein. In some implementations, the calibration module 120 may be further configured to receive input data defining properties or specifications of the quantum device 102, e.g., properties of the physical system included in the quantum device. For example, in cases where the quantum device 102 includes a circuit of superconducting qubits, the calibration module 120 may receive input data defining one or more circuit parameters, e.g., capacitance, inductance or critical current.

The calibration module 120 includes a modelling module 108, an optimizer component 110, and an elementary matrices and operators database 114. The modelling module 108 is configured to receive data representing physical model parameters, e.g., specifications or properties of the physical quantum system included in the quantum device 102, and to process the received data to generate a parameterized numerical physical model that represents the physical quantum system included in the quantum device 102 for a respective configuration of control biases. In some cases, the numerical physical model may include a Hamiltonian, also called a Hamiltonian matrix herein, characterizing the physical quantum system for a fixed respective configuration of control biases. In some implementations, determining a Hamiltonian matrix that characterizes the physical quantum system may include applying one or more approximations, e.g., a Born-Oppenheimer Approximation, as described below with reference to FIGS. 3 to 5.

The modelling module 108 may be configured to use generated numerical physical models or Hamiltonian matrices to generate a set of predictive data. The type of predicted data generated by the modelling module 108 may depend on the type of received experimental data. For example, in cases where the received experimental data includes elements of data representing a measured energy value of the physical quantum system included in the quantum device 102 for a particular configuration of control biases, the modelling module 108 may generate a set of predictive data that includes elements of data representing predicted energy values derived from a corresponding physical model of the physical quantum system included in the quantum device 102. The predictive data is dependent on the physical model parameters and particular configurations of control biases. In some cases each data item included in the predictive data is dependent on all of the physical model parameters.

In some cases, the calibration module 120 may access the elementary matrices and operators database 114 when determining a Hamiltonian characterizing the physical quantum system included in the quantum device 102. For example, the elementary matrices and operators database 114 may store matrices that form building blocks for constructing Hamiltonians, derivatives of Hamiltonians or observables associated with the Hamiltonians.

The optimizer module 110 is configured to receive the experimental data, e.g., input data 116, and corresponding predictive data. The optimizer module 110 is configured to perform numerical optimization techniques, e.g., nonlinear regression techniques, to determine revised physical model parameters. For example, the optimizer module 110 may be configured to minimize a cost function that is dependent on obtained experimental data and correspondingly generated predictive data to determine revised, e.g., optimized, physical model parameters.

Minimizing a cost function may include calculating a gradient of the cost function with respect to the physical model parameters. In some implementations the optimizer module 110 may be configured to implement techniques that reduce the complexity of determining such gradients. For example, the optimizer module 110 may be configured to apply matrix perturbation theory techniques to efficiently approximate the gradients, as described below with reference to FIGS. 3 and 4.

As described below with reference to FIG. 3, minimizing the cost function to determine revised physical model parameters may be an iterative process and therefore the optimizer module 110 is configured to repeatedly perform numerical optimization to iteratively adjust values of the physical model parameters until termination criteria are met and final revised physical model parameters are obtained.

The calibration module 120 may be configured to provide as output data representing revised physical model parameters, e.g., output data 118. In some implementations the revised physical model parameters may be used to control the physical quantum system included in the quantum device 102. For example, in cases where the quantum device 102 is a quantum annealing device, the revised physical model parameters may be used to precisely determine control biases required to simulate a specific quantum Hamiltonian In other cases such as quantum computing applications, the revised physical model parameters may be used to precisely determine control biases required to implement a given quantum logic gate. Increasing the accuracy of determined physical model parameters can increase the accuracy with which the quantum device 102 can be controlled.

In some implementations the revised physical model parameters may be used to adjust the physical quantum system included in the quantum device 102, e.g., to adjust the specification of the quantum device or adjust how the device is operated. For example, in cases where the quantum device 102 includes a quantum annealer device, the revised physical model parameters may be used to refine a trajectory of control biases to more closely match a desired Hamiltonian trajectory. As another example, in quantum computation applications the revised physical model parameters can be used to predict coherence and fidelity properties of a given quantum logic gate, allowing for modifications of the gate that improve those properties.

Figure 2:
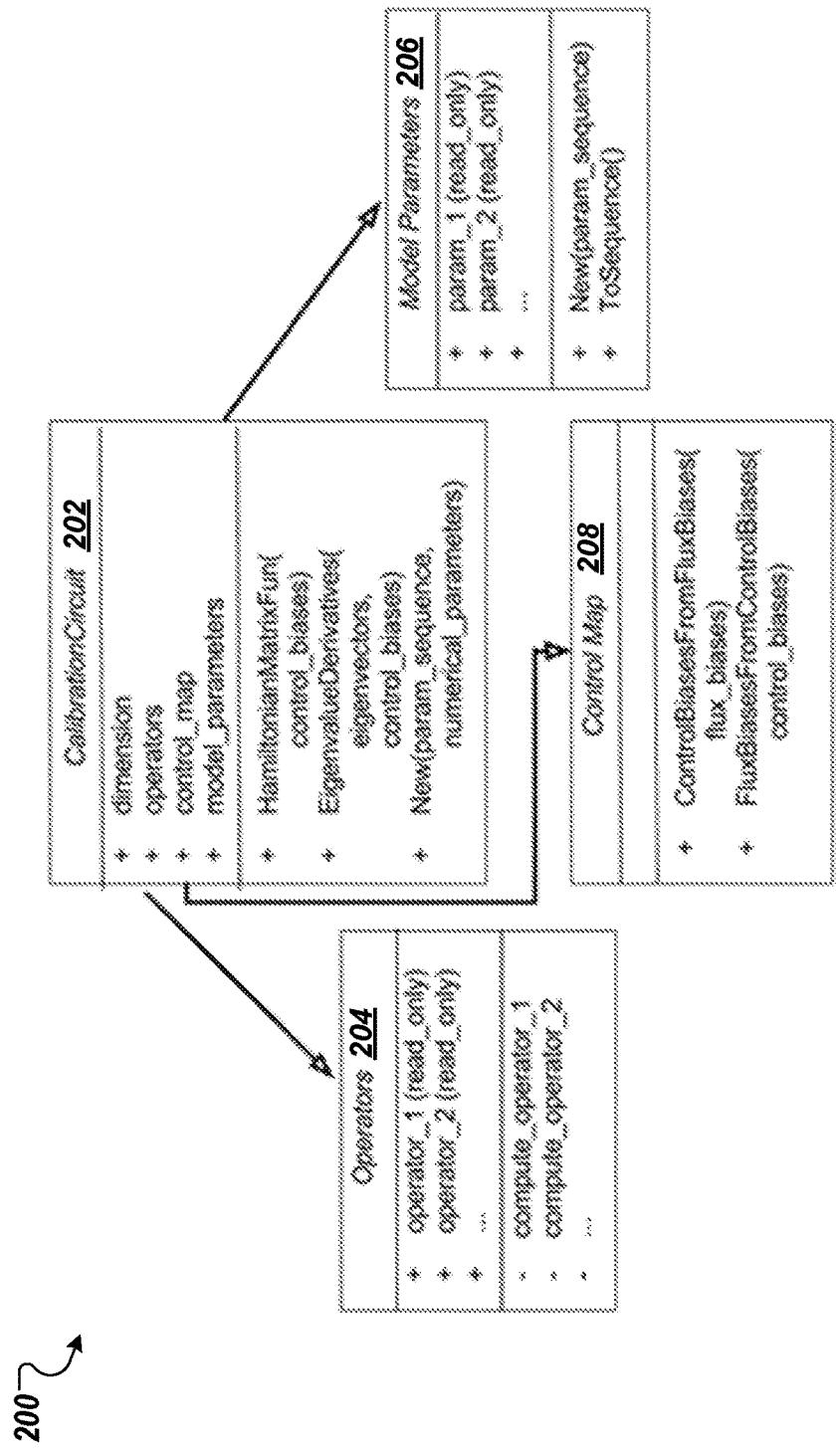
FIG. 2 is a schematic design diagram of exemplary computer programming classes used to perform physical parameter calibration.

FIG. 2 is a schematic design diagram 200 of exemplary computer programming classes that may be used to perform physical parameter calibration. For example, the calibration module 120 described with reference to FIG. 1, may use the example classes.

The schematic design diagram 200 includes a CalibrationCircuit class 202, an Operator class 204, a ModelParameter class 206, and a ControlMap class 208.

The CalibrationCircuit class 202 represents an abstract class interface. The CalibrationCircuit class 202 representing the general functionality required for a calibration procedure, e.g., as described herein with reference to FIG. 3. The CalibrationCircuit class 202 contains four component objects: a dimension object which represents an effective size of the physical quantum system included in the quantum device 102, as well as objects satisfying the Operators class 204, ModelParameter class 206, and ControlMap class interface 208.

In addition, the CalibrationCircuit class 202 implements three methods (functions): HamiltonianMatrixFun, which returns the system's Hamiltonian matrix given control biases as inputs, an EigenvalueDerivatives function which returns the derivatives of the eigenvalues of the Hamiltonian matrix given both corresponding eigenvectors and control biases as inputs, and a New constructor function which returns a new CalibrationCircuit object given physical model parameters and numerical parameters as inputs.

An object satisfying the Operators class interface 204 is used to generate and store elementary matrices that form building blocks for constructing Hamiltonians, derivatives of Hamiltonians or observables associated with the Hamiltonians, as in the Elementary Matrices and Operators module 114. Each elementary matrix (e.g., operator) may be generated on demand and stored internally within this object for later use.

An object satisfying the ModelParameter class interface 206 stores and encodes the physical model parameters of the physical quantum system. The object allows for individual, e.g., read-only, access of each named model parameter, which may be generated and stored in the ModelParameter class 206 upon its creation. In general model parameters are stored in separate arrays corresponding to each physical quantity they represent, for example an inductance matrix or a vector of flux bias offsets. The object has a New method, which takes an ordered sequence of numbers and uses them to construct a new ModelParameters object. The object also has an AsSequence method, which converts returns the ordered sequence of numbers that would reproduce itself when passed into the New method.

The object satisfying the ControlMap (208) class interface is tasked with mapping experimental control biases into data structures used in the construction of the Hamiltonian matrix and other matrices used in the CalibrationCircuit interface. The object has two methods, ControlBiasesFromFluxBiases and FluxBiasesFromControlBiases. The ControlBiasesFromFluxBiases method takes flux biases array vectors (used specifically in the case of superconducting flux qubits) and returns the corresponding experimental control biases. The FluxBiasesFromControlBiases method implements an inverse operation of the ControlBiasesFromFluxBiases method.

Programming the Hardware

Figure 3:
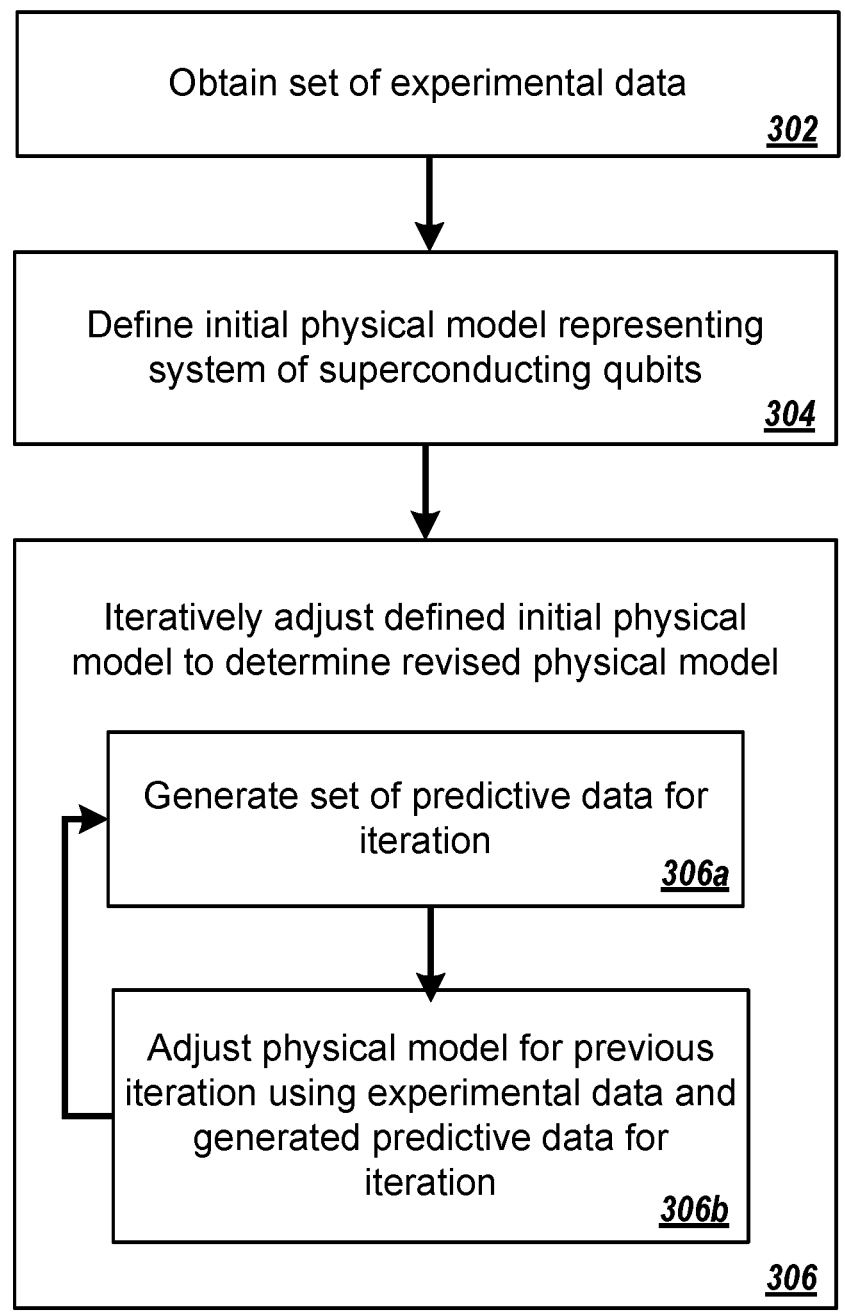
FIG. 3 is a flow diagram of an example process for generating a revised physical model representing a system of qubits.

FIG. 3 is a flowchart of an example process 300 for generating revised physical model parameters representing a system of superconducting qubits operable via a set of control biases. For convenience, the process 300 will be described as being performed by a system of one or more classical and/or quantum computing devices located in one or more locations. For example, a calibration system, e.g., the system 100 of FIG. 1, appropriately programmed in accordance with this specification, can perform the process 300.

The system obtains a set of experimental data (step 302). In some implementations, the system may be configured to perform measurements on the system of superconducting qubits in order to obtain the set of experimental data. In other implementations, the system may be configured to obtain the set of experimental data from another source, e.g., a database storing measurement results.

Elements $E_1=E(\bar{z}_1)$, $E_2=E(\bar{z}_2)$, . . . in the set of experimental data correspond to respective configurations of control biases $\bar{z}$, e.g., respective configurations of biases that are proportional to external voltages or currents applied to effect changes to qubits in the system of superconducting qubits. In addition, elements in the set of experimental data represent measurement results of observables of the system of superconducting qubits for respective configurations of control biases $\bar{z}$. For example, the set of experimental data may include N elements, where the i-th element corresponds to an i-th configuration of control biases $\bar{z}_i$ and includes a measurement result $E_i=E(\bar{z}_i)$ of an observable $A_i=A(\bar{z}_i)$ of the system of superconducting qubits.

In some implementations an observable $A_i$ may include a Hamiltonian describing the system of superconducting qubits for a respective configuration of control biases $\bar{z}_i$. In these implementations, the obtained set of experimental data includes measured energy spectrum values of the system of superconducting qubits for respective configurations of control biases. In other implementations, the obtained set of experimental data may include other measurement values, as described below with reference to step 306a.

The system defines initial physical model parameters representing the system of superconducting qubits (step 304). For example, the system may obtain the initial physical model parameters from the modelling module 108 described herein with reference to FIG. 1. In some cases, defining the initial physical model parameters may include applying experimental techniques to generate initial estimates of the physical model parameters. This may be achieved through direct measurements of a system of superconducting qubits, numerical calculations, or in some cases educated guessing. The collection of estimated model parameters may then be used to define the initial physical model.

The system iteratively adjusts the initial physical model parameters to determine revised physical model parameters representing the system of superconducting qubits (step 306). Iteratively adjusting the initial physical model parameters to determine revised physical model parameters representing the system of superconducting qubits includes iteratively generating a set of predictive data that corresponds to the set of obtained experimental data and adjusting the initial (or subsequently determined) physical model parameters using the obtained set of experimental data and the generated set of predictive data until a termination criteria is met, as described in more detail below.

More specifically, at each iteration the system may generate a set of predictive data for the iteration (step 306a). The generated set of predictive data for the iteration corresponds to the set of experimental data. That is the generated set of predictive data for the iteration is intended to match the set of experimental data and reflects properties of the experimental data, e.g., measurement type and control biases. For example, in cases where the experimental data includes measured energy spectrum values of the system of superconducting qubits at different configurations of control biases, the set of predictive data for the iteration may include predicted energy spectrum values of the system of superconducting qubits for the same different configurations of control biases.

In some cases, for example those where the experimental data includes measured energy spectrum values, an element $E_{m,i}(\bar{z}_i; \bar{\lambda})$ of the generated set of predictive data for the iteration represents the difference between the two smallest eigenvalues of a Hamiltonian matrix characterizing the system of superconducting qubits represented by physical model parameters $\bar{\lambda}$ for a previous iteration with control bias configuration $\bar{z}_i$. Generally, elements in a generated set of predictive data are dependent on the physical model parameters $\bar{\lambda}$ and a respective configuration of control biases $\bar{z}_i$. In some cases, each element in the set of predictive data may be dependent on all the model parameters.

The physical model parameters represent physical parameters, e.g., physical properties, which are fixed for a given system of superconducting qubits but may vary between systems of superconducting qubits. For example, the physical model parameters may include a capacitance of a capacitor included in the system, or a critical current of a Josephson junction included in the system. As another example, the physical model parameters may include parameters that determine how a given control bias changes a Hamiltonian matrix describing the physical system of superconducting qubits, e.g. a mutual inductance between a qubit circuit and a nearby control wire determines how much flux is applied to the qubit from a given amount of control current. Generating a set of predictive data is described in more detail below with reference to FIG. 4.

At each iteration, the system may then adjust the physical model parameters for the previous iteration using the set of experimental data obtained in step 302 above and the generated set of predictive data for the iteration (step 306b). For example, at each iteration the system may adjust a set of model parameters for a previous iteration by defining a cost function for the iteration that depends on differences between elements of the set of experimental data, as described above with reference to step 302, and elements of the set of predictive data for the previous iteration, as described above with reference to step 306a. The defined cost function may then be optimized, e.g., minimized, with respect to the physical model parameters. Due to the iterative nature of the process, the cost function is therefore evaluated iteratively over a sequence of adjusted physical model parameters, where each evaluation is dependent on a respective generated set of predictive data and corresponds to a different set of physical model parameters.

In some implementations, optimizing the cost function may include applying nonlinear regression. An example cost function may be given by $$C(\overline{\lambda}) = \frac{1}{2N}\sum_{i=1}^{N}(E(\overline{z}_i) - E_m(\overline{z}_i; \overline{\lambda}))^2$$

where $\overline{\lambda}$ represents a vector of model parameters, N represents the number of configurations of control biases $\overline{z}_i$, $E(\overline{z}_i)$ represents experimental data corresponding to control bias configuration i and $E_m(\overline{z}_i; \overline{\lambda})$ represents predictive data for a previous iteration corresponding to control bias configuration i.

To optimize the defined cost function for the iteration with respect to the physical model parameters, the system may determine gradients of the cost function with respect to the physical model parameters. In some implementations determining gradients of the cost function with respect to the physical model parameters may include applying matrix perturbation theory. For example, when the experimental data corresponds to a measurement of the energy spectrum, the predicted data may be computed as $$E_m(\overline{z}_i; \overline{\lambda}) = h_1(\overline{z}_i; \overline{\lambda}) - h_0(\overline{z}_i; \overline{\lambda})$$

where $h_j$ represents the j-th eigenvalue of the Hamiltonian $H(\overline{z}, \overline{\lambda})$ characterizing the system of superconducting qubits represented by the physical model parameters and control bias configuration $\overline{z}$. In this case, the system may compute gradients of the cost function with respect to the physical model parameters using the identity $$\partial_{\lambda_k} h_j = \langle h_j | (\partial_{\lambda_k} H(\overline{z}, \overline{\lambda})) | h_j \rangle$$

where $\lambda_k$ represents the k-th model parameter. The row and column vectors $\langle h_j |$ and $|h_j\rangle$ represent the j-th eigenvector of A). The derivative $\partial_{\lambda_k} H(\overline{z}, \overline{\lambda})$ of the Hamiltonian matrix is dependent on the system of interest, e.g., the specifics of the system of superconducting qubits. For example, the derivative may be computed by taking the symbolic derivative of the Hamiltonian matrix as if it were a scalar function of $\lambda_k$, then constructing the Hamiltonian matrix derivative using the same (or analogous) matrix building blocks used to construct the original Hamiltonian matrix. In some implementations, the derivative of the cost function defined above may then be calculated by application of the product rule, $$\partial_{\lambda_k} C(\overline{\lambda}) = \frac{1}{N}\sum_{i=1}^{N}(E(\overline{z}_i) - E_m(\overline{z}_i; \overline{\lambda}))\partial_{\lambda_k}(h_1(\overline{z}, \overline{\lambda}) - h_0(\overline{z}, \overline{\lambda}))$$

where $h_0(\overline{z}, \overline{\lambda})$ represents the lowest eigenvalue of the Hamiltonian $H(\overline{z}, \overline{\lambda})$ and $h_1(\overline{z}, \overline{\lambda})$ represents the second lowest eigenvalue of the Hamiltonian $H(\overline{z}, \overline{\lambda})$. In other implementations the derivative of the cost function defined above may be estimated using additional eigenvalues of the Hamiltonian $H(\overline{z}, \overline{\lambda})$, e.g., one or more higher eigenvalues or the entire eigenvalue spectrum.

For convenience, the above described steps 306a and 306b are described with reference to generating predictive data corresponding to measurement of the energy spectrum of the system of qubits, however the process 300 may be equally applicable to and generalized to cases where the data corresponds to measurements of other quantum mechanical observables.

The system generates the final revised physical model parameters after the termination of the iterative sequence of one or multiple model parameter adjustments (steps 306a-306b). As described above, the system may terminate the iterative process of adjusting the physical model parameters using standard numerical termination conditions, such as when the value of the cost function is sufficiently small or when the model parameters change slowly between updates. The final revised physical model parameters may therefore be equal to values of the physical model parameters obtained in a final iteration.

The final revised physical model parameters may be used by the system as calibrated physical model parameters. For example, the system may adjust the specification of the system of superconducting qubits, adjust how the system of superconducting qubits is operated, or perform simulations of the system of superconducting qubits using the final revised physical model parameters.

Figure 4:
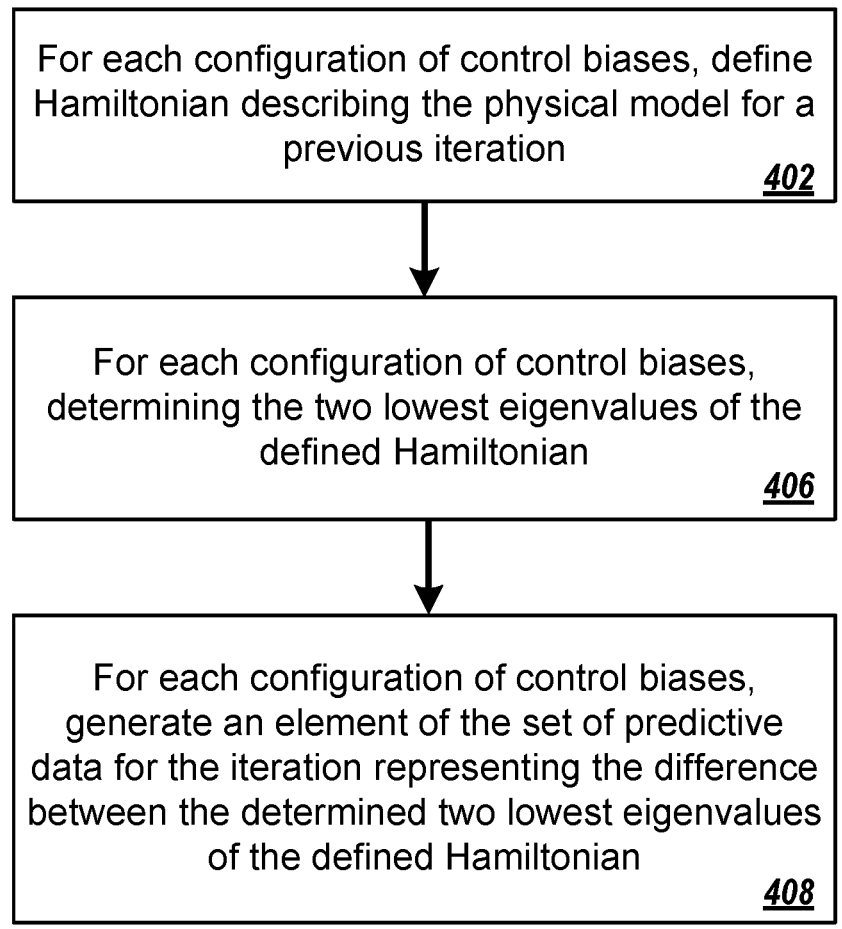
FIG. 4 is a flow diagram of an example process for generating a set of predictive data for a system of qubits.

FIG. 4 is a flowchart of an example process 400 for generating a set of predictive data for a system of superconducting qubits for a current iteration. For convenience, the example process 400 is described in the context of generating a set of predictive data corresponding to the energy spectrum of a system of superconducting qubits, however the process 400 may equally be applied to generating predictive data corresponding to other observable measurements. The example process 400 will be described as being performed by a system of one or more classical and/or quantum computing devices located in one or more locations. For example, a calibration system, e.g., the system 100 of FIG. 1, appropriately programmed in accordance with this disclosure specification, can perform the process 400.

The system defines, for different configurations of control biases, a Hamiltonian characterizing the system of superconducting qubits represented by physical model parameters determined at a previous iteration (step 402). Unlike the physical model parameters, the defined Hamiltonian $H = H(\overline{z}, \overline{\lambda})$ depends on a respective configuration of control biases $\overline{z}$ (and the physical model parameters $\overline{\lambda}$.) The defined Hamiltonians may be represented as numerical matrices.

An example definition of a Hamiltonian characterizing a fluxmon circuit is now described. In some cases, a Hamiltonian matrix of a basic fluxmon circuit can be decomposed into two parts:

$$H(\overline{\varphi}_s, \overline{\varphi}_t) = H_t + H_{nl}(\overline{\varphi}_s, \overline{\varphi}_t).$$

The first term, $H_l$ represents a physically linear contribution of the Hamiltonian, e.g., due to linear inductors and capacitors. The total Hamiltonian matrix H is written in the eigenvector basis of this part, and therefore $H_l$ may not be a diagonal matrix. The first part $H_l$ may be given by $$H_1 = \bigoplus_n \hbar\omega_n(a_n^\dagger a_n + 1/2)$$

where the direct sum is over the elementary components of the circuit, e.g., the normal modes. The numbers $\hbar\omega_n$ represent characteristic energies of the components, e.g., normal modes. The entries of the diagonal matrix $(a_n{}^\backslash a_n+1/2)$ may be given by $$(a_n{}^\backslash a_n+1/2)_{ij}=\delta_{ij}(1/2+i)$$

where i starts at 0. The matrices $(a_n{}^\backslash a_n+1/2)$ act on different vector spaces, hence the direct sum.

The second term $H_{nl}$ represents the physically nonlinear part of the Hamiltonian matrix, e.g., due to Josephson junctions. The second term may be written explicitly as the (not direct) sum $$H_{n1}(\overline{\varphi}_s, \overline{\varphi}_t) = \sum_j H_{n1}^{(j)}(\varphi_{s,j}, \varphi_{t,j})$$

where the index j runs over the effective Josephson junctions in the system. Individual junction components may be computed as the real part of a tensor product $$H_{n1}^{(j)}(\varphi_{s,j}, \varphi_{t,j}) = \text{Re}\left[s_j(\varphi_{s,j}, \varphi_{t,j}) \otimes_n e^{iR_{j,n}(a_n^\dagger + a_n)}\right]$$

where the coefficient $s_j$ is the complex scalar function $$s_j(\varphi_{s,j}, \varphi_{t,j}) = -E_j^{(j)} e^{i\varphi_{t,j}}(\cos(\varphi_{s,j}/2) + i\chi_j \sin(\varphi_{s,j}/2))$$

where $\overline{E}_j$ is a vector of Josephson energies and $\overline{\chi}$ is a vector of junction asymmetries of each effective Josephson junction (e.g., a DC-SQUID).

In some cases the angle vectors $\overline{\varphi}_s$ and $\overline{\varphi}_t$ may not be directly adjustable in a physical device. In a real device an affine map between the tunable control biases and the following angles may exist:

$$\varphi_s(\overline{z})=M_s\overline{z}+\overline{\varphi}_s^{DC}$$

$$\varphi_t(\overline{z})=M_t\overline{z}+\overline{\varphi}_t^{DC}$$

In the above angles, the matrices M and offsets $\overline{\varphi}^{DC}$ may be fixed physical parameters, and the vector $\overline{z}$ represents the actual control biases to which the experimenter has access.

The fixed physical parameters may be used to determine a (control bias dependent) matrix $$H(\varphi_s(\overline{z}), \varphi_t(\overline{z})).$$

The functional representation of the matrix H means that the matrices $\oplus e^{iR}{}_{j,n}(a_n{}^\backslash+a_n)$ and $H_l$ need to only be constructed once and stored internally (as in the Operators (204) class interface described above with reference to FIG. 2). When the functional representation of the matrix H is evaluated, a linear combination of these matrices is taken (with the imaginary parts being discarded). In some implementations this may lead to a speedup if the matrix H is to be evaluated at many different configurations of control bias values $\overline{z}$.

In some implementations the system may define an effective Hamiltonian describing the system of superconducting qubits for a particular configuration of control biases. An effective Hamiltonian may include a Hamiltonian that describes interactions between the superconducting qubits with fewer components compared to other, non-effective Hamiltonians as described above. For example, an effective Hamiltonian may incorporate the effects of components such as couplers between qubits into the characterization of the qubits themselves, thereby reducing the number of interacting components explicitly represented by the effective Hamiltonian.

To define an effective Hamiltonian, the system may apply an approximation, e.g., the Born-Oppenheimer Approximation, to obtain an effective interaction between qubits by eliminating coupler degrees of freedom. In the case of the Born-Oppenheimer Approximation this can be achieved by fixing qubit degrees of freedom and assuming that a coupler connecting the qubits remains in its ground state. For example, the system may compute both classical and quantum parts of a coupler ground state energy $E_g$ and set this quantity equal to a corresponding qubit-qubit interaction potential. An example process for defining an effective Hamiltonian using a Born-Oppenheimer Approximation is described in more detail with reference to FIG. 5.

The system determines, for different configurations of control biases, the two lowest eigenvalues of the respectively defined Hamiltonians (step 406). That is, the system determines $h_0(\overline{z}, \overline{\lambda})$, $h_1(\overline{z}, \overline{\lambda})$ where $H(\overline{z}, \overline{\lambda})|h_j\rangle = h_j|h_j\rangle$ In some implementations the system may further determine, for different configurations of control biases, one or more additional eigenvalues of the respectively defined Hamiltonians, e.g., one or more higher eigenvalues or the entire eigenvalue spectrum. For example, in cases where the set of experimental data described above with reference to step 302 of FIG. 3 includes data measured in a higher energy spectrum the system may determine higher eigenvalues in order to generate a set of corresponding predictive data.

For different configurations of control biases, the system defines a respective element of the set of predictive data as the difference between the determined two lowest eigenvalues of the defined Hamiltonian (step 408). That is, the system defines $E_m(\overline{z}_i, \overline{z}_j; \overline{\lambda}):=h_1(\overline{z}_i; \overline{\lambda})-h_0(\overline{z}_i; \overline{\lambda})$.

Figure 5:
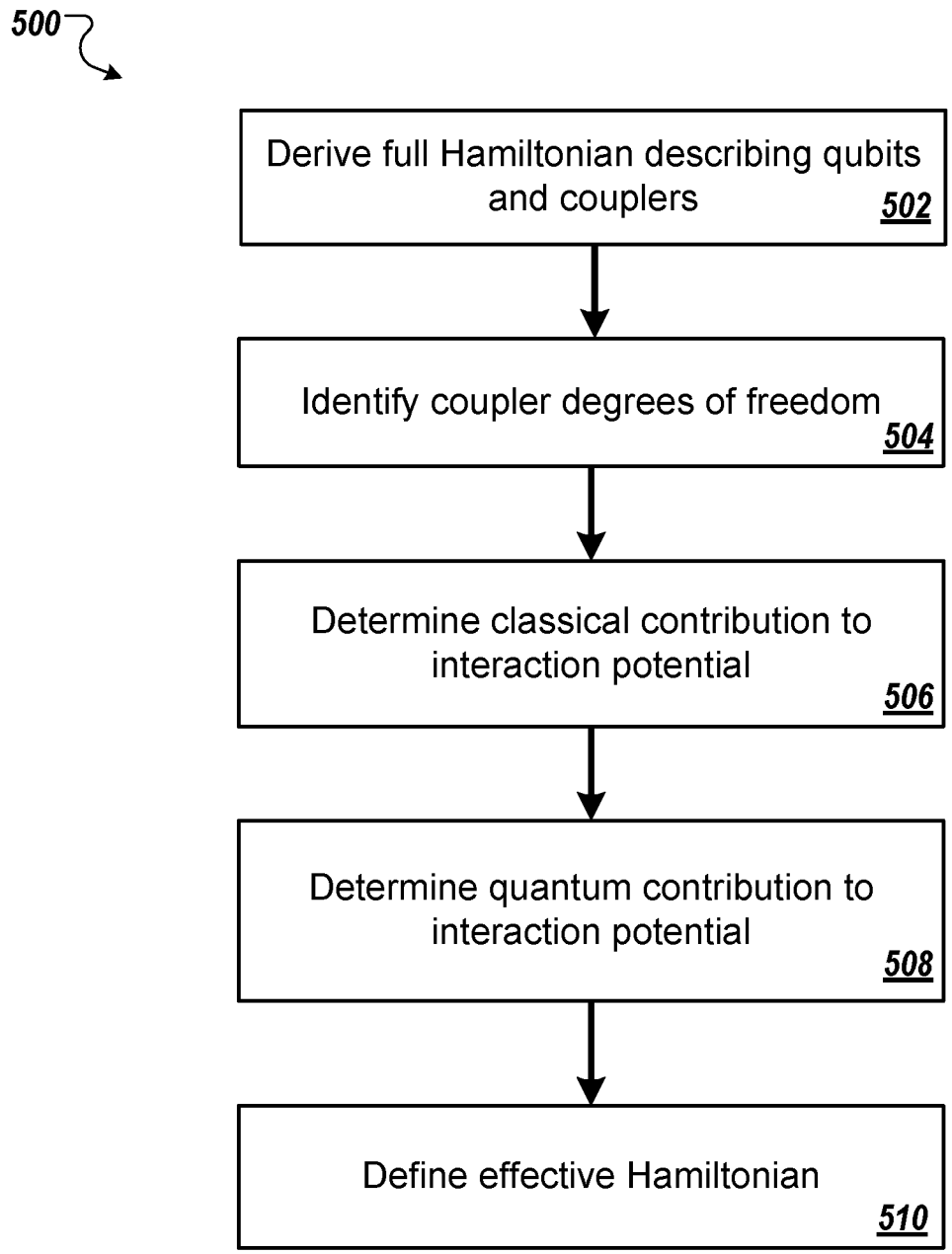
FIG. 5 is a flow diagram of an example process for defining an effective Hamiltonian for a qubit-coupler quantum system using a Born-Oppenheimer Approximation

FIG. 5 is a flow diagram of an example process 500 defining an effective Hamiltonian for a qubit-coupler quantum system using a Born-Oppenheimer Approximation. For convenience, the process 500 will be described as being performed by a system of one or more classical and/or quantum computing devices located in one or more locations. For example, a calibration system, e.g., the system 100 of FIG. 1, appropriately programmed in accordance with this specification, can perform the process 500.

The system defines a full, i.e., non-effective, Hamiltonian describing the qubit-coupler quantum system (step 502). For convenience, the defined Hamiltonian is described as characterizing a quantum circuit for inductive coupling of k superconducting circuits (where each circuit represents a qubit) to a main coupler loop. The strength and type of coupling can be tuned via an external magnetic flux $\phi_{cx}$ applied through the main coupler loop. The main coupler loop may include a junction, e.g., a DC-SQUID forming an effective Josephson junction with tunable junction parameters $I_c^{(c)}$ via a separate flux bias.

Under the assumption that the qubits interact with the coupler through a geometric mutual inductance $M_j$, the system may determine current equations defining the dynamics of the qubits as $$C\ddot{\phi}_c + I_c^{(c)}\sin(2\mid\pi\phi_c/\phi_0) - I_{L,c} = 0, \quad (1)$$

$$I_j - I_j^* = 0 \ (1 \le j \le k).$$

In the first equation, $\phi_c$ represents a flux across the coupler's Josephson junction and capacitor, $I_{L,c}$ represents the current through the coupler's inductor, and $\phi_0 = h/(2e)$ represents the flux quantum. The second equation may show that the current $I_j$ through the j-th qubit's inductor is equal to the current $I^*_j$ flowing through the rest of the qubit circuit.

The inductive and flux quantization relationships may then be given by $$L_c I_{L,c} + \sum_{j=1}^{k} M_j I_j = \Phi_{L,c}, \quad (2)$$

$$L_j I_j + M_j I_{L,c} = \Phi_j,$$

$$\Phi_{L,c} = \Phi_{cx} - \Phi_c,$$

where $L_c$ represents the coupler's inductance, $I_{L,c}$ represents the current through the coupler's inductor, $M_j$ represents geometric mutual inductance, $I_j$ represents current through the j-th qubit's inductor, $\phi_{cx}$ represents external flux bias applied to the coupler loop, $L_j$ represents the qubit circuit's inductance, and $\phi_j$ represents flux across qubit j's inductor. Using the equation (2), the current equations (1) may be rewritten as $$C\ddot{\Phi}_c + I_c^{(c)}\sin(2\pi\Phi_c/\Phi_0) + \frac{1}{\tilde{L}_c}\left(\Phi_c - \Phi_{cx} + \sum_{j=1}^{k}\alpha_j\Phi_j\right) = 0, \quad (3)$$

$$\frac{\Phi_j}{L_j} + \alpha_j \frac{1}{\tilde{L}_c}\left(\Phi_c - \Phi_{cx} + \sum_{j'=1}^{k}\alpha_{j'}\Phi_{j'}\right) - I_j^* = 0, \quad (4)$$

where $$\alpha_j \equiv \frac{M_j}{L_j},$$

$$\tilde{L}_c \equiv L_c - \sum_{j=1}^{k}\alpha_j M_j.$$

In equations (3) and (4), $\tilde{L}_c$ represents a rescaled coupler inductance which, in turn, represents a shift in the coupler's inline inductance due to its interaction with the qubits, and $\alpha_j$ represents the dimensionless coupling efficiency between the qubit circuit and the coupler.

Equations (3) and (4) represent Euler-Lagrange equations for the qubits and coupler. Since the $\phi$-dependent terms correspond to derivatives of the potential energy, the full Hamiltonian for the qubit-coupler system can be given by $$\hat{H} = \frac{\hat{Q}_c^2}{2C} - E_{J_c}\cos(2\pi\hat{\Phi}_c/\Phi_0) + \frac{\left(\hat{\Phi}_c - \Phi_{cx} + \sum_{j=1}^{k}\alpha_j\hat{\Phi}_j\right)^2}{2\tilde{L}_c} + \sum_{j=1}^{k}\hat{H}_j. \quad (5)$$

where $\hat{H}_j$ represents a Hamiltonian for qubit j in the absence of the coupler, e.g., in the limit $\alpha_j \to 0$, $\hat{Q}_c$ represents a canonical conjugate to $\hat{\phi}_c$ satisfying $[\hat{\phi}_c, \hat{Q}_c] = i\hbar$, and the coupler's Josephson energy may be given by $E_{J_c} = \phi_0 I_c^{(c)}/2\pi$.

The system identifies coupler degrees of freedom (step 504). For example, the system may apply a Born-Oppenheimer approximation by identifying and fixing the slow degrees of freedom and assuming that the fast degrees of freedom are always in their ground state. The identification is performed by comparing the characteristic energy scales of each degree of freedom. The slow (fast) degrees of freedom are those with comparably much smaller (larger) characteristic energy scales. In this case and in typical superconducting flux qubit implementations, the system identifies the slow degrees of freedom as those of the qubits and the fast degrees of freedom as those of the coupler. This may be analogous to the Born-Oppenheimer approximation in quantum chemistry, in which the nuclei (qubits) evolve adiabatically with respect to the electrons (coupler). The coupler's ground-state energy (a function of the slow qubit variables $\Phi_j$) may then determine the interaction potential between the qubits. This approximation may be valid as long as the coupler's intrinsic frequency is much larger than other energy scales in the system, namely, the qubits' characteristic frequencies and qubit-coupler coupling strength.

The system considers the coupler-dependent part of the Hamiltonian $\hat{H}_c = \hat{H} - \Sigma_j \hat{H}_j$. This operator can be expressed in terms of standard dimensionless parameters $$\hat{H}_c = E_{L_c}\left[4\zeta_c^2 \frac{\hat{q}_c^2}{2} + U(\hat{\varphi}_c; \varphi_x)\right], \quad (6)$$

$$U(\hat{\varphi}_c; \varphi_x) = \frac{(\varphi_c - \varphi_x)^2}{2} + \beta_c\cos(\varphi_c).$$

where $$E_{L_c} = \frac{(\Phi_0/2\pi)^2}{\tilde{L}_c}, \quad (7)$$

$$\zeta_c = \frac{2\pi e}{\Phi_0}\sqrt{\frac{\tilde{L}_c}{C}} = 4\pi\bar{Z}_c/R_K,$$

$$\beta_c = 2\pi\tilde{L}_c I_c^{(c)}/\Phi_0 = E_{J_c}/E_{L_c},$$

$$\hat{q}_c = \frac{\hat{Q}_c}{2e},$$

$$\hat{\varphi}_c = \frac{2\pi}{\Phi_0}\hat{\Phi}_c + \pi,$$

$$\varphi_{cx} = \frac{2\pi}{\Phi_0}\Phi_{cx} + \pi,$$

$$\hat{\varphi}_j = \frac{2\pi}{\Phi_0}\hat{\Phi}_j.$$

$$\varphi_x = \varphi_{cx} - \left(\sum_{j=1}^{k}\alpha_j\varphi_j\right).$$

$$[\hat{\varphi}_c, \hat{q}_c] = i.$$

In the above expression, $\hat{\phi}_c$ and $\phi_{cx}$ have been defined with a $\pi$ phase shift. Typical coupler inductive energies may be on the order of $$\frac{E_{L_c}}{h} \sim 0.5 - 2 \ THz.$$

Therefore, the system may assume $\beta_c \lesssim 1$ (monostable coupler regime) and low impedance ($\lambda_c \ll 1$), consistent with typical qubit-coupler implementations. The external flux $\phi_x$ is momentarily being treated as a scalar parameter of the Hamiltonian. Since $\hat{\phi}_x$ is a function of the qubit fluxes $\hat{\phi}_j$, the coupler's ground-state energy $E_g(\phi_x)$ may act as an effective potential between the qubit circuits. The full effective qubit Hamiltonian under Born-Oppenheimer may therefore be given by $\hat{H}_{BO}=\Sigma_j \hat{H}_j + E_g(\hat{\phi}_x)$ where the variable $\phi_x$ is promoted back to an operator.

In order to derive an analytic expression for the ground-state energy $E_g(\phi_x)$ the system decomposes it into classical and quantum parts. This natural decomposition may allow for a precise approximation to the ground-state energy because the classical part (corresponding to the classical minimum value of $H_c$) is the dominant contribution to the energy and can be derived exactly. The quantum part (corresponding to the zero-point energy) is the only approximate contribution, though it is relatively small for typical circuit parameters.

The system represents the potential energy $U(\hat{\phi}_c; \phi_x)$ in an alternative form given below $$U(\varphi_c; \varphi_x) = U_{min}(\varphi_x) + U_{ZP}(\hat{\phi}_c; \varphi_x). \tag{8}$$

where the scalar $$U_{min}(\varphi_y) = \min_{\psi_c} U(\varphi_c; \varphi_x) = \frac{(\varphi_c^{(c)}; \varphi_x)^2}{2} + \beta_c \cos(\varphi_c^{(c)})$$

represents the value of the coupler potential at its minimum point $\phi_c^{(*)}$, i.e., its "height" (overall offset) above zero. Setting the qubit-qubit interaction potential $E_g(\phi_x)$ equal to only $E_{L_c}$, $U_{min}(\phi_x)$ may correspond to a completely classical analysis of the coupler dynamics (originating from equations (3) and (4)). Unlike $U_{min}(\phi_x)$, the operator $U_{ZP}$ does not have a classical analog: it corresponds to extra energy due to the finite width of the coupler's ground-state wave function. Combining this operator with the charging energy defines the coupler's zero-point energy $$U_{ZPE}(\varphi_x) = \min_{\langle\psi|\psi\rangle=1} \left\langle \psi \left| 4\zeta_c^2 \frac{q_c^2}{2} + U_{ZP}(\hat{\phi}_c; \varphi_x) \right| \psi \right\rangle. \tag{9}$$

In equation (9), the minimization picks out the ground state. The coupler's ground-state energy may then be given by the sum of the classical and zero point energy terms:

$$E_g/E_{L_x} = U_{min}(\varphi_x) + U_{ZPE}(\varphi_x). \tag{10}$$

Both contributions to the energy are parametrized by the qubit dependent flux $\phi_x$, which allows $E_g$ to be treated as an effective qubit-qubit interaction potential.

The system determines a classical contribution to the interaction potential (506). Using equation (6) above, the minimum value $U_{min}(\phi_x)$ can be written in terms of the minimum point $\phi(*)_c$ as $$U_{min}(\varphi_x) = U(\varphi_c^{(*)}; \varphi_x) = \frac{|\beta_c \sin(\varphi_c^{(*)})|^2}{2} + \beta_c \cos\varphi_c^{(*)}, \tag{11}$$

where the fact that $\phi(*)_c$ is a critical point has been applied, namely that $$\partial_{\varphi_c} U(\varphi_c; \varphi_x)|_{\varphi_c=\varphi(*)_c} = \varphi(*)_c - \varphi_x - \beta_c \sin(\varphi(*)_c) = 0. \tag{12}$$

The parameter $\phi(*)_c$ is a function of $\phi_x$ and is defined implicitly as the solution to equation (12). This equation is identical to the classical current equation (3) in the large coupler plasma frequency limit $\tilde{L}_c C \to 0$.

Although equation (11) is exact, it is not useful unless $\phi(*)_c$ is expressed as an explicit function of the qubit degrees of freedom, i.e., the variable $\phi_x$. It is observed that the transcendental equation (12) is unchanged under the transformation $\phi(*)_c \to \phi(*)_c + 2\pi$, $\phi_x \to \phi_x + 2\pi$, and similarly that $U_{min}(\varphi_x)$ is a periodic function of $\phi(*)_c$ (see equation (11)). This suggests that $U_{min}(\phi_x)$ may be expressed as a Fourier series in $\phi_x$. For example, for every integer $\mu$, $$e^{i\mu\varphi_c^{(*)}} = \sum_\nu e^{i\nu\varphi_x} A_\nu^{(\mu)}, \tag{13}$$

where $$A_\nu^{(\mu)} = \begin{cases} \delta_{\mu,0} - \dfrac{\beta_c}{2}(\delta_{\mu,1} + \delta_{\mu,-1}) & \nu = 0, \\ \dfrac{\mu \int_{\nu-\mu} (\beta_c \nu)}{\nu} & \nu \neq 0, \end{cases} \tag{14}$$

and $J_\nu(x)$ denotes the Bessel function of the first kind.

Using equations (13) and (14) with $$\sin(\phi_c^{(*)}) = \frac{1}{2i}\left(e^{i\phi_c^{(*)}} - e^{-i\phi_c^{(*)}}\right)$$

gives $$\sin_{\beta_c} \equiv \sin(\varphi_c^{(*)}) \tag{15}$$

$$= \sum_\nu e^{i\nu\varphi_i} \frac{1}{2i}(A_\nu^{(1)} - A_{-\nu}^{(1)})$$

$$= \sum_{\nu>0} \frac{2J_\nu(\beta_c \nu)}{\beta_c \nu} \sin(\nu\varphi_x),$$

The function $\sin_{\beta_c}(\phi_x)$ represents an explicit solution to $(\sin(\phi(*)_c))$ satisfying equation (12) above, and therefore satisfies the identity $$\sin_{\beta_c}(\varphi_x) = \sin[\varphi_x + \beta_c \sin_{\beta_c}(\varphi_x)]. \tag{16}$$

Since $\sin_{\beta_c}(\phi_x) = (\sin(\phi(*)_c))$, $\phi(*)_c$ can be written as $$\varphi(*)_c = \varphi_x + \beta_c \sin_{\beta_c}(\varphi_x). \tag{17}$$

Substituting these results into equation (11) gives an expression for the minimum value $U_{min}(\phi_x)$:

$$U_{min}(\varphi_x) = \frac{[\beta_c \sin_{\beta_c}(\varphi_x)]^2}{2} + \beta_c \cos[\varphi_x + \beta_c \sin_{\beta_c}(\varphi_x)]. \tag{18}$$

The system then derives the Fourier series for $U_{min}(\phi_x)$ as a function of $\phi_x$. Taking the derivative of equation (18) with respect to $\phi_x$ gives $$\partial_{\varphi_x} U_{min}(\varphi_x) = -\beta_c \sin_{\beta_c}(\varphi_x). \tag{19}$$

where the identity $$\partial_{\varphi_x} \sin_{\beta_c}(\varphi_x) = \frac{\cos[\varphi_x + \beta_c \sin_{\beta_c}(\varphi_x)]}{1 - \beta_c \cos[\varphi_x + \beta_c \sin_{\beta_c}(\varphi_x)]}. \tag{20}$$

has been used. Using equation (16), equation (19) is analogous to)

$$\partial_{\varphi_x}\cos(\varphi_x) = -\sin(\varphi_x).$$

which suggests that $U_{min}(\varphi_x)$ be defined as $$U_{min}(\varphi_x) = \beta_c \cos_{\beta_c}(\varphi_x). \tag{21}$$

In analogy with sine and cosine functions, the system determines that $$\cos_\beta(\varphi_x) \equiv 1 - \int_0^{\varphi_x} \sin_\beta(\theta)d\theta \tag{22}$$

$$= \frac{\beta}{2}[\sin_\beta(\varphi_x)]^2 + \cos[\varphi_x + \beta\sin_\beta(\varphi_x)]$$

$$= 1 + \sum_{v>0} \frac{2J_v(\beta v)}{\beta v^2}[\cos(v\varphi_x) - 1]$$

$$= -\frac{\beta}{4} + \sum_{v \neq 0} \frac{J_v(\beta v)}{\beta v^2} e^{iv\varphi_x}.$$

Equations (21) and (22) may exactly characterize the classical part of the coupler's ground state energy $E_g$.

The system determines a quantum contribution to the interaction potential (step 508). The quantum part of the coupler ground state energy may be given by the ground state energy of $\hat{H}_c - E_{\hat{L}_c} U_{min}(\phi_x)$ which represents the coupler's zero point energy. To approximate this energy the zero point potential, $U_{ZP} = U(\hat{\phi}_c; \phi_x) - U_{min}(\phi_x)$ is expanded in a Taylor series about the classical minimum point $\phi(*)_c$. Since $U_{ZP}$ and its derivative vanish at the minimum point, the Taylor series of $U_{ZP}$ can be written as $$\hat{H}_c / E_{\hat{L}_c} = \tag{23}$$

$$U_{min}(\varphi_x) + \left[4\zeta_c^2 \frac{\hat{q}_c^2}{2} + \frac{U_{ZP}^\mu(\varphi_c^{(*)}; \varphi_x)}{2}(\hat{\phi}_c - \varphi_c^{(*)})^2\right] + O((\hat{\phi}_c - \varphi_c^{(*)})^3),$$

where $$U_{ZP}^\mu(\varphi_c; \varphi_x) = \partial_{\varphi_c}^2 U(\varphi_c; \varphi_x) = 1 - \beta_c \cos(\varphi_c). \tag{24}$$

Neglecting terms of order $O(((\hat{\phi}_c - \phi(*)_c)^3)$, the zero point energy of $\hat{H}_c$ may be the same as for a harmonic oscillator:

$$U_{ZPE} \simeq \frac{1}{2}\sqrt{4\zeta_c^2 U_{ZP}^\mu(\varphi_c^{(*)}; \varphi_x)} = \zeta_c \sqrt{1 - \beta_c \cos(\varphi_c^{(*)})}. \tag{25}$$

The harmonic approximation is the second approximation used to derive the qubit-qubit interaction potential. As is done for the classical component $U_{min}(\phi_x)$, the system computes the Fourier series of $U_{ZPE}$ in the qubit-dependent flux parameter $\phi_x$. The system writes $U_{ZPE}$ as a Fourier series in $\phi(*)_c$:

$$\sqrt{1 - \beta\cos(\varphi_c^{(*)})} = \sum_\mu G_\mu(\beta) e^{i\mu\varphi_c^{(*)}}, \tag{26}$$

where the functions $G_\mu(\beta)$ satisfy[4]

$$G_\mu(\beta) = \sum_{l \geq 0} \binom{1/2}{\mu + 2l}\binom{\mu + 2l}{l}\left(-\frac{\beta}{2}\right)^{\mu+2l} = \tag{27}$$

$$\left(-\frac{\beta}{2}\right)^\mu \binom{1/2}{\mu} {}_2F_1\left(\frac{\mu}{2} - \frac{1}{4}, \frac{\mu}{2} + \frac{1}{4}; 1 + \mu; \beta^2\right),$$

and $_2F_1$ represents the confluent hypergeometric function. Combining this with equation (13) gives $$U_{ZPE}(\varphi_x) = \tag{28}$$

$$\zeta_c \left\{G_0(\beta_c) - \beta_c G_1(\beta_c) + \sum_{v \neq 0} e^{iv\varphi_x}\left[\frac{1}{v}\sum_\mu \mu G_\mu(\beta_c) J_{v-\mu}(\beta_c v)\right]\right\}.$$

The system defines the effective Hamiltonian (step 510). Having computed both classical and quantum parts of the coupler ground-state energy $E_g$, the system sets this quantity equal to the qubit-qubit interaction potential. In the language of physical chemistry, $E_g(\phi_x)$ represents the potential energy surface that varies with the qubit flux variables $\phi_j$. This value can be determined using equations (21) and (28):

$$E_S(\varphi_x)/E_{\hat{L}_c} = \beta_c \cos_{\beta_c}(\varphi_x) + U_{ZPE}(\varphi_x) = \sum_v e^{iv\varphi_x} B_v, \tag{29}$$

where $$B_v = \begin{cases} -\frac{\beta_c^2}{4} + \zeta_c[G_0(\beta_c) - \beta_c G_1(\beta_c)], & v = 0 \\ \frac{J_v(\beta_c v)}{v^2} + \zeta_c\left[\sum_\mu \frac{\mu}{v} G_\mu(\beta_c) J_{v-\mu}(\beta_c v)\right], & v \neq 0 \end{cases} \tag{30}$$

With this result the system completes the Born-Oppenheimer approximation: substituting for $\phi_x = \phi_{cx} - \Sigma_j \alpha_j \phi_j$, the interaction potential mediated by the coupler may be given by $$\hat{H}_{int} = E_S\left(\varphi_{cx} - \sum_j \alpha_j \hat{\varphi}_j\right) = E_{\hat{L}_c} \sum_v B_v e^{iv\varphi_{cx}} e^{-iv\left(\sum_j \mu_j \hat{\phi}_j\right)}. \tag{31}$$

Where $\hat{H}_{int}$ is a Hermitian operator and can be expressed as a Fourier cosine series.

Implementations of the digital and/or quantum subject matter and the digital functional operations and quantum operations described in this specification can be implemented in digital electronic circuitry, suitable quantum circuitry or, more generally, quantum computational systems, in tangibly-embodied digital and/or quantum computer software or firmware, in digital and/or quantum computer hardware, including the structures disclosed in this specification and their structural equivalents, or in combinations of one or more of them. The term "quantum computational systems" may include, but is not limited to, quantum computers, quantum information processing systems, quantum cryptography systems, or quantum simulators.

Implementations of the digital and/or quantum subject matter described in this specification can be implemented as one or more digital and/or quantum computer programs, i.e., one or more modules of digital and/or quantum computer program instructions encoded on a tangible non-transitory storage medium for execution by, or to control the operation of, data processing apparatus. The digital and/or quantum computer storage medium can be a machine-readable storage device, a machine-readable storage substrate, a random or serial access memory device, one or more qubits, or a combination of one or more of them. Alternatively or in addition, the program instructions can be encoded on an artificially-generated propagated signal that is capable of encoding digital and/or quantum information, e.g., a machine-generated electrical, optical, or electromagnetic signal, that is generated to encode digital and/or quantum information for transmission to suitable receiver apparatus for execution by a data processing apparatus.

The terms quantum information and quantum data refer to information or data that is carried by, held or stored in quantum systems, where the smallest non-trivial system is a qubit, i.e., a system that defines the unit of quantum information. It is understood that the term "qubit" encompasses all quantum systems that may be suitably approximated as a two-level system in the corresponding context. Such quantum systems may include multi-level systems, e.g., with two or more levels. By way of example, such systems can include atoms, electrons, photons, ions or superconducting qubits. In many implementations the computational basis states are identified with the ground and first excited states, however it is understood that other setups where the computational states are identified with higher level excited states are possible.

The term "data processing apparatus" refers to digital and/or quantum data processing hardware and encompasses all kinds of apparatus, devices, and machines for processing digital and/or quantum data, including by way of example a programmable digital processor, a programmable quantum processor, a digital computer, a quantum computer, multiple digital and quantum processors or computers, and combinations thereof. The apparatus can also be, or further include, special purpose logic circuitry, e.g., an FPGA (field programmable gate array), an ASIC (application-specific integrated circuit), or a quantum simulator, i.e., a quantum data processing apparatus that is designed to simulate or produce information about a specific quantum system. In particular, a quantum simulator is a special purpose quantum computer that does not have the capability to perform universal quantum computation. The apparatus can optionally include, in addition to hardware, code that creates an execution environment for digital and/or quantum computer programs, e.g., code that constitutes processor firmware, a protocol stack, a database management system, an operating system, or a combination of one or more of them.

A digital computer program, which may also be referred to or described as a program, software, a software application, a module, a software module, a script, or code, can be written in any form of programming language, including compiled or interpreted languages, or declarative or procedural languages, and it can be deployed in any form, including as a stand-alone program or as a module, component, subroutine, or other unit suitable for use in a digital computing environment. A quantum computer program, which may also be referred to or described as a program, software, a software application, a module, a software module, a script, or code, can be written in any form of programming language, including compiled or interpreted languages, or declarative or procedural languages, and translated into a suitable quantum programming language, or can be written in a quantum programming language, e.g., QCL or Quipper.

A digital and/or quantum computer program may, but need not, correspond to a file in a file system. A program can be stored in a portion of a file that holds other programs or data, e.g., one or more scripts stored in a markup language document, in a single file dedicated to the program in question, or in multiple coordinated files, e.g., files that store one or more modules, sub-programs, or portions of code. A digital and/or quantum computer program can be deployed to be executed on one digital or one quantum computer or on multiple digital and/or quantum computers that are located at one site or distributed across multiple sites and interconnected by a digital and/or quantum data communication network. A quantum data communication network is understood to be a network that may transmit quantum data using quantum systems, e.g. qubits. Generally, a digital data communication network cannot transmit quantum data, however a quantum data communication network may transmit both quantum data and digital data.

The processes and logic flows described in this specification can be performed by one or more programmable digital and/or quantum computers, operating with one or more digital and/or quantum processors, as appropriate, executing one or more digital and/or quantum computer programs to perform functions by operating on input digital and quantum data and generating output. The processes and logic flows can also be performed by, and apparatus can also be implemented as, special purpose logic circuitry, e.g., an FPGA or an ASIC, or a quantum simulator, or by a combination of special purpose logic circuitry or quantum simulators and one or more programmed digital and/or quantum computers.

For a system of one or more digital and/or quantum computers to be "configured to" perform particular operations or actions means that the system has installed on it software, firmware, hardware, or a combination of them that in operation cause the system to perform the operations or actions. For one or more digital and/or quantum computer programs to be configured to perform particular operations or actions means that the one or more programs include instructions that, when executed by digital and/or quantum data processing apparatus, cause the apparatus to perform the operations or actions. A quantum computer may receive instructions from a digital computer that, when executed by the quantum computing apparatus, cause the apparatus to perform the operations or actions.

Digital and/or quantum computers suitable for the execution of a digital and/or quantum computer program can be based on general or special purpose digital and/or quantum processors or both, or any other kind of central digital and/or quantum processing unit. Generally, a central digital and/or quantum processing unit will receive instructions and digital and/or quantum data from a read-only memory, a random access memory, or quantum systems suitable for transmitting quantum data, e.g. photons, or combinations thereof.

The essential elements of a digital and/or quantum computer are a central processing unit for performing or executing instructions and one or more memory devices for storing instructions and digital and/or quantum data. The central processing unit and the memory can be supplemented by, or incorporated in, special purpose logic circuitry or quantum simulators. Generally, a digital and/or quantum computer will also include, or be operatively coupled to receive digital and/or quantum data from or transfer digital and/or quantum data to, or both, one or more mass storage devices for storing digital and/or quantum data, e.g., magnetic, magneto-optical disks, optical disks, or quantum systems suitable for storing quantum information. However, a digital and/or quantum computer need not have such devices.

Digital and/or quantum computer-readable media suitable for storing digital and/or quantum computer program instructions and digital and/or quantum data include all forms of non-volatile digital and/or quantum memory, media and memory devices, including by way of example semiconductor memory devices, e.g., EPROM, EEPROM, and flash memory devices; magnetic disks, e.g., internal hard disks or removable disks; magneto-optical disks; CD-ROM and DVD-ROM disks; and quantum systems, e.g., trapped atoms or electrons. It is understood that quantum memories are devices that can store quantum data for a long time with high fidelity and efficiency, e.g., light-matter interfaces where light is used for transmission and matter for storing and preserving the quantum features of quantum data such as superposition or quantum coherence.

Control of the various systems described in this specification, or portions of them, can be implemented in a digital and/or quantum computer program product that includes instructions that are stored on one or more non-transitory machine-readable storage media, and that are executable on one or more digital and/or quantum processing devices. The systems described in this specification, or portions of them, can each be implemented as an apparatus, method, or system that may include one or more digital and/or quantum processing devices and memory to store executable instructions to perform the operations described in this specification.

While this specification contains many specific implementation details, these should not be construed as limitations on the scope of what may be claimed, but rather as descriptions of features that may be specific to particular implementations. Certain features that are described in this specification in the context of separate implementations can also be implemented in combination in a single implementation. Conversely, various features that are described in the context of a single implementation can also be implemented in multiple implementations separately or in any suitable sub-combination. Moreover, although features may be described above as acting in certain combinations and even initially claimed as such, one or more features from a claimed combination can in some cases be excised from the combination, and the claimed combination may be directed to a sub-combination or variation of a sub-combination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system modules and components in the implementations described above should not be understood as requiring such separation in all implementations, and it should be understood that the described program components and systems can generally be integrated together in a single software product or packaged into multiple software products.

Particular implementations of the subject matter have been described. Other implementations are within the scope of the following claims. For example, the actions recited in the claims can be performed in a different order and still achieve desirable results. As one example, the processes depicted in the accompanying figures do not necessarily require the particular order shown, or sequential order, to achieve desirable results. In some cases, multitasking and parallel processing may be advantageous.

What is claimed is:

1. A computer-implemented method for generating a revised physical model, the revised physical model representing a system of superconducting qubits and being suitable for use in simulating the system of superconducting qubits, the system of superconducting qubits operable via a set of control biases, the method comprising:
    obtaining a set of experimental data, wherein elements in the set of experimental data (i) correspond to a respective configuration of control biases, and (ii) comprise a measurement result of an observable of the system of superconducting qubits for the respective configuration of control biases;
    defining a physical model representing the system of superconducting qubits, the physical model comprising a Hamiltonian matrix, wherein the Hamiltonian matrix is dependent on one or more model parameters and the set of control biases;
    generating and storing matrix components included in a functional representation of the Hamiltonian matrix;
    iteratively adjusting the defined physical model to determine a revised physical model representing the system of superconducting qubits, comprising, for each iteration:
        generating a set of predictive data for the iteration, the generated set of predictive data corresponding to the set of experimental data, wherein elements in the set of predictive data for the iteration (i) represent a difference between the two smallest eigenvalues of the Hamiltonian matrix included in the physical model, and (ii) are dependent on at least one model parameter of the physical model; and
        adjusting the physical model using the obtained experimental data and the generated set of predictive data for the iteration, comprising:
            defining a cost function that depends on differences between elements of the set of experimental data and elements of the set of predictive data; and
            minimizing the defined cost function with respect to the at least one model parameter, comprising computing a symbolic derivative of a scalar function of the at least one model parameter included in the functional representation of the Hamiltonian matrix, retrieving one or more of the stored matrix components, and computing a gradient of the cost function with respect to the at least one model parameter using the symbolic derivative and retrieved one or more stored matrix components;
    determining, using the revised physical model, one or more control bias configurations that, when applied to the superconducting qubits, cause the system of superconducting qubits to have one or more target properties; and
    applying, to the superconducting qubits, the one or more control bias configurations.

2. The method of claim 1, further comprising using the revised physical model to model a behavior of the system of superconducting qubits.

3. The method of claim 2, wherein using the revised physical model to model the behavior of the system of superconducting qubits comprises:
    fixing the revised physical model.

4. The method of claim 1, wherein the system of superconducting qubits comprises a quantum annealer circuit.

5. The method of claim 1, wherein generating a set of predictive data for an iteration comprises, for each configuration of control biases:

defining the Hamiltonian matrix included in the physical model, the Hamiltonian matrix being dependent on the configuration of control biases and the at least one model parameter;
determining a two smallest eigenvalues of the defined Hamiltonian matrix; and p1 generating an element of the set of predictive data for the configuration of control biases representing the difference between the determined two smallest eigenvalues of the defined Hamiltonian matrix.

6. The method of claim 1, wherein defining the physical model comprises applying experimental techniques to estimate the at least one model parameter.

7. The method of claim 1, wherein the cost function is represented by $$C(\bar{\lambda}) = \frac{1}{2N} \sum_{t=1}^{N} (E(\bar{z}_t) - E_m(\bar{z}_t; \bar{\lambda}))^2$$

where $\bar{\lambda}$ represents the at least one model parameter, N represents the number of configurations of control biases $\bar{z}_t$, $E(\bar{z}_t)$ represents experimental data corresponding to control bias configuration i and $E_m(\bar{z}_t; \bar{\lambda})$ represents predictive data corresponding to control bias configuration i.

8. The method of claim 1, wherein determining gradients of the cost function with respect to the at least one model parameter comprises applying matrix perturbation theory.

9. The method of claim 8, wherein applying matrix perturbation theory comprises using eigenvalues and eigenvectors of the Hamiltonian matrix included in the physical model.

10. The method of claim 1, wherein the Hamiltonian matrix included in the physical model comprises an effective Hamiltonian describing interactions between the superconducting qubits.

11. The method of claim 10, wherein the effective Hamiltonian is defined using a physical approximation.

12. The method of claim 10, wherein the Hamiltonian matrix included in the physical model describes more interacting components than the effective Hamiltonian.

13. The method of claim 1, wherein the observable comprises Hamiltonians describing the system of superconducting qubits for respective configurations of control biases, and wherein the set of experimental data comprises measured energy spectrum values of the system of superconducting qubits for respective configurations of control biases.

14. The method of claim 13, wherein the set of predictive data comprises predicted energy spectrum values of the system of superconducting qubits for respective configurations of control biases.

15. The method of claim 1, wherein the superconducting qubits comprise flux qubits.

16. The method of claim 15, wherein the control biases comprise voltages or currents.

17. The method of claim 1, wherein the at least one model parameter comprises a physical parameter defining the system of superconducting qubits.

18. An apparatus comprising:
a classical computing device; and
a quantum computing device, wherein the quantum computing device comprises a plurality of superconducting qubits operable via a set of control biases,
wherein the classical computing device and quantum computing device are configured to perform operations comprising:
obtaining a set of experimental data, wherein elements in the set of experimental data (i) correspond to a respective configuration of control biases, and (ii) comprise a measurement result of an observable of the system of superconducting qubits for the respective configuration of control biases;
defining a physical model representing the system of superconducting qubits, the physical model comprising a Hamiltonian matrix, wherein the Hamiltonian matrix is dependent on one or more model parameters and the set of control biases;
generating and storing matrix components included in a functional representation of the Hamiltonian matrix;
iteratively adjusting the defined physical model to determine a revised physical model representing the system of superconducting qubits, comprising, for each iteration:
generating a set of predictive data for the iteration, the generated set of predictive data corresponding to the set of experimental data, wherein elements in the set of predictive data for the iteration (i) represent a difference between the two smallest eigenvalues of the Hamiltonian matrix included in the physical model, and (ii) are dependent on at least one model parameter of the physical model; and
adjusting the physical model using the obtained experimental data and the generated set of predictive data for the iteration, comprising:
defining a cost function that depends on differences between elements of the set of experimental data and elements of the set of predictive data; and
minimizing the defined cost function with respect to the at least one model parameter, comprising computing a symbolic derivative of a scalar function of the at least one model parameter included in the functional representation of the Hamiltonian matrix, retrieving one or more of the stored matrix components, and computing a gradient of the cost function with respect to the at least one model parameter using the symbolic derivative and retrieved one or more stored matrix components;
determining, using the revised physical model, one or more control bias configurations that, when applied to the superconducting qubits, cause the system of superconducting qubits to have one or more target properties; and
applying, to the superconducting qubits, the one or more control bias configurations.

* * * * *